US007602068B2

(12) United States Patent
Coolbaugh et al.

(10) Patent No.: US 7,602,068 B2
(45) Date of Patent: Oct. 13, 2009

(54) DUAL-DAMASCENE PROCESS TO FABRICATE THICK WIRE STRUCTURE

(75) Inventors: Douglas D. Coolbaugh, Essex Junction, VT (US); Keith E. Downes, Stowe, VT (US); Peter J. Lindgren, Essex Junction, VT (US); Anthony K. Stamper, Williston, VT (US)

(73) Assignee: International Machines Corporation, Armonk, NY (US)

( * ) Notice: Subject to any disclaimer, the term of this patent is extended or adjusted under 35 U.S.C. 154(b) by 267 days.

(21) Appl. No.: 11/275,604

(22) Filed: Jan. 19, 2006

(65) Prior Publication Data

US 2006/0099761 A1  May 11, 2006
US 2007/0190718 A1  Aug. 16, 2007

(51) Int. Cl.
*H01L 23/52* (2006.01)

(52) U.S. Cl. .............................. 257/773; 257/E23.142

(58) Field of Classification Search ................ 257/213, 257/288, 296, 310, 734, 741, 750, 762, 773, 257/774, 775, 776, E23.141–E23.152
See application file for complete search history.

(56) References Cited

U.S. PATENT DOCUMENTS

| 5,763,010 | A  | * | 6/1998  | Guo et al. ................. 427/376.2 |
| 6,143,640 | A  |   | 11/2000 | Cronin et al. |
| 6,383,920 | B1 |   | 5/2002  | Wang et al. |
| 6,429,119 | B1 |   | 8/2002  | Chao et al. |
| 6,466,427 | B1 |   | 10/2002 | Chen |
| 6,797,630 | B1 |   | 9/2004  | Wu et al. |
| 6,828,245 | B2 |   | 12/2004 | Chang |
| 2001/0054730 | A1 | * | 12/2001 | Kim et al. .................... 257/301 |
| 2004/0094821 | A1 |   | 5/2004  | Lur et al. |
| 2004/0256654 | A1 | * | 12/2004 | Korner et al. ................ 257/306 |
| 2005/0054194 | A1 |   | 3/2005  | Tsai et al. |

* cited by examiner

*Primary Examiner*—Sue Purvis
*Assistant Examiner*—Kevin Quinto
(74) *Attorney, Agent, or Firm*—Richard Kotulak; Greenblum & Bernstein P.L.C.

(57) ABSTRACT

A method and semiconductor device. In the method, at least one partial via is etched in a stacked structure and a border is formed about the at least one partial via. The method further includes performing thick wiring using selective etching while continuing via etching to at least one etch stop layer.

9 Claims, 9 Drawing Sheets

DUAL-DAMASCENE PROCESS TO FABRICATE THICK WIRE STRUCTURE

FIELD OF THE INVENTION

The invention generally relates to a semiconductor device and method of manufacture and, more particularly, to a semiconductor device having analog, or super thick, wires and a method of manufacturing thereof using a dual-damascene process.

BACKGROUND DESCRIPTION

Super thick damascene copper (Cu) wires (e.g., >2 um thick) are currently fabricated with single damascene processing. The use of a single damascene process is mainly due to integration problems associated with dual-damascene processing, including the problem of contacting both MIM capacitors and underlying wiring layers during the via and wire etching processes.

In the super thick dual-damascene Cu wire processes, the vias and trenches are defined using conventional lithography steps. In these conventional processes, the via is about 5.5. μm in height and at about 1.5 μm in width. After the formation of the via, the via is filled with spin on organic material such as, for example, anti-reflective coating (ARC), to the underlying Cu wiring layer Mx, for a trough lithographic step.

However, it has been found that the second dual-damascene lithography step is difficult to make work in the super thick damascene Cu wire processes. By way of example, for a via first, trench last process, it has been found that the ARC forms an hourglass formation in the via which, in turn, results in large voids in the via. More specifically, it has been found that none of the industry standard mid UV (MUV) or Deep UV (DUV) ARCs achieved more than 40% fill, with all of them leaving large voids in the vias which opened up during trough etch. And, due to these voids, subsequent etching caused corrosion in an underlying metal layer due to the etchant etching through the voids.

If the ARC, for example, is made thicker, there is better fill properties within the via; however, other problems arise during the subsequent etching process. For example, acceptable via fill can be achieved using an 0.8 um layer, but this severely complicates the trough RIE due to the very long ARC open step required, and due to large fences or rails generated around the vias during trough RIE. More specifically, during the RIE process using the thicker ARC fill, fences are formed on the sides of the via, early in the trough RIE process. This leads to preferential etching along the via edges down to an underlying metal (Mx) layer. Thus, it was found that when the ARC is of about 0.8 um, there is resist erosion, massive fencing and trough RIE (reactive ion etching) problems.

The invention is directed to overcoming one or more of the problems as set forth above.

SUMMARY OF THE INVENTION

In a first aspect of the invention, a method comprises etching at least one partial via in a stacked structure and forming a border about the at least one partial via. The method further includes performing thick wiring using selective etching while continuing via etching to at least one etch stop layer.

In embodiments, the performing step is part of a dual-damascene process. The forming of the border comprises forming a negative photoresist on the stacked structure and exposing portions of the negative photoresist remote from the at least one partial via. The at least one etch stop layer comprises a first etch stop layer over an Mx-1 metal layer and a second etch stop layer over a metal insulator metal (MIM) capacitor. The etch stop layer over the MIM capacitor is formed thicker than the etch stop layer over the Mx-1 metal layer.

The method further includes incorporating a metal insulator metal (MIM) capacitor into the stacked structure and the thick wiring extends to the at least one etch stop layer over the MIM capacitor. The forming the stacked structure comprises providing a damascene copper wire formed in a first low K dielectric material and forming an etch stop layer on the first low K dielectric material. An interlevel dielectric layer and second dielectric layer is formed on the etch stop layer. A second etch stop layer is formed on the second low K dielectric layer, and a third low K dielectric layer is formed on the etch stop layer.

The MIM capacitor comprises refractory metals or alloys comprising at least one W, WN, TiN, Ta, TaN and TiSiN. The at least one of the first and second low K dielectric material and the second dielectric layer is fluorine doped silicate glass (FSG). The etch stop layer and the second etch stop layer is at least silicon nitride, silicon carbo nitride, silicon oxy carbo nitride and silicon carbide. The MIM capacitor is embedded in the interlevel dielectric layer. The MIM capacitor is a plurality of plates with at least one of a silicon nitride, silicon carbo nitride, silicon oxy carbo nitride and silicon carbide etch stop layer.

The etching the at least one partial via includes partially etching the stacked structure in alignment with at least one of an underlying metal layer and MIM capacitor. The performing step comprises depositing negative photoresist on the stacked structure after the formation of the at least one partial via, exposing the negative photoresist, remote from the at least one partial via to form a border, etching the at least one partial via further into the stacked structure and selectively etching to form at least one trough. The selective etching is selective to the at least one etch stop layer deposited on at least one of an underlying metal layer and MIM capacitor.

In embodiments, the steps of the invention are used for fabrication of integrated circuit chips. The steps of the invention are a dual-damascene copper back end of line (BEOL) process, in which copper layers defined as a wire and via height have a thickness of about 3.5 microns or greater. The performing thick wiring using selective etching while continuing via etching to at least one etch stop layer includes a trough etch which extends to an upper embedded etch layer before the via extends to the at least one etch stop layer.

In another aspect of the invention, the method is directed to making a dual-damascene copper BEOL structure. The method comprising forming a partial height via in alignment with at least an underlying metal layer and applying a negative photoresist material. The method further includes forming a border in the negative photoresist material proximate the partial height via and etching the partial height via to a further depth and selectively etching to form a trough. The method further includes incorporating a MIM capacitor into the BEOL structure.

In embodiments, the etching step includes etching to at least an etch stop layer above a metal layer and the MIM capacitor. The method further comprises providing the underlying metal formed in a first low K dielectric material, forming an etch stop layer on the first low K dielectric material, forming an oxide layer and interlevel dielectric layer on the etch stop layer, embedding the MIM capacitor in the silicon dioxide layer, forming a cap layer on the MIM capacitor, forming a second etch stop layer on the interlevel dielectric layer, and forming a third low K dielectric layer on the etch stop layer.

The etch stop layer and the second etch stop layer is at least one of a silicon nitride, silicon carbo nitride, silicon oxy carbo nitride and silicon carbide etch stop layer. The MIM capacitor is formed using a plurality of plates with at least one of a silicon nitride, silicon carbo nitride, silicon oxy carbo nitride and silicon carbide etch stop. The etching the partial height via to a further depth and selectively etching to form a trough includes etching the trough to an upper embedded etch layer before the via hits at least another etch stop layer. The forming of the border comprises exposing portions of the negative photoresist remote from the partial height via. The etching a trough comprises selectively etching to at least one of a cap layer over the MIM capacitor and an underlying metal layer. The etching the partial height via to a further depth and selectively etching to form a trough is in alignment with at least one of the underlying metal layer and the MIM capacitor.

In another aspect of the invention, a dual-damascene method for fabricating a thick wire structure comprises forming a partial via in a stacked structure and depositing negative photoresist on the stacked structure after the formation of the partial via. The method further includes exposing the negative photoresist, remote from the partial via to form a border above the partial via. The partial via is etched further into the stacked structure. The method further includes selectively etching into the partial via to form a trough. The selective etching is selective to at least one etch stop layer deposited on at least one of an underlying metal layer. A MIM has at least an upper plate MIM dielectric and a lower plate.

In embodiments, the thick wire structure has a thickness of about 3.5 microns or greater. The steps are designed for fabrication of integrated circuit chips. The MIM capacitor is formed by sputter clean removal of a MIM top plate of less than 10 nanometer oxide equivalent sputter removal such that the via is not fully etched through the upper plate and is not in contact with the MIM dielectric. The at least one etch stop is a first etch stop and a second etch stop. The first etch stop is formed over the underlying metal layer and the second etch stop is formed on a surface of the MIM capacitor and formed with a height greater than a height of the first etch stop.

In another aspect of the invention, a thick wire structure comprises a damascene copper wire formed in a first dielectric layer and an etch stop layer covering the damascene copper wire. A second dielectric layer is formed on the etch stop layer. A second etch stop layer is formed on the second dielectric layer and a third dielectric layer is formed on the etch stop layer. A via approximately 1.5 microns or taller us formed through the first, second and third dielectric layer and contacts the damascene copper wire. A trough approximately 2 microns or taller is formed proximate to the second etch stop and in substantial axial alignment with the via and having a width larger than the via. A MIM capacitor is embedded in the oxide layer and an etch stop layer is formed over the MIM capacitor. The via is in alignment with and extends to the etch stop layer formed over the MIM capacitor and the trough is in axial alignment with the via formed over the MIM capacitor and stops near the second etch stop. A dielectric stack is approximately 5.5 um tall, with approximately 3.5 um tall wires and the via has a minimum width of approximately 1.2 um.

In an aspect of the invention, a thick wire structure comprises an underlying wire formed in a FSG (fluorine doped silicate glass) dielectric material. A first nitride cap layer covers the underlying wire. An interlevel layer is formed on the first nitride cap layer. A MIM capacitor is embedded in a portion of the interlevel layer. A MIM etch stop cap layer is formed on the MIM capacitor, where the MIM cap layer has a thickness greater than the first nitride cap. A second nitride cap layer is formed on the interlevel layer. An FSG dielectric layer is formed on the second nitride cap. A via is in alignment with at least one of the underlying wire and the MIM capacitor, extending proximate to the MIM nitride cap layer and the first nitride cap layer. A trough is in substantial axial alignment with the via and having a width larger than the via and extending to the second nitride cap layer. In embodiments, the MIM capacitor is composed of refractory metals or alloys comprising at least one W, WN, TiN, Ta, TaN and TiSiN.

DETAILED DESCRIPTION OF EMBODIMENTS OF THE INVENTION

The invention generally relates to a semiconductor device and method of manufacture and, more particularly, to a method of manufacturing a device with thick wires using a dual-damascene process. By using the dual-damascene process of the invention, problems such as punch through at the edges of the via, via under etch, trough under etch or over etch are eliminated. The process of the invention additionally eliminates corrosive effects on the underlying metal layer and/or MIM (metal insulator metal) capacitor. In one implementation, the dual-damascene process of the invention includes, for example, forming a partial depth via, applying a negative photoresist material, and then etching a trough and completing the via etch. The method optionally includes incorporating a MIM capacitor or other passive element, such as a thin film resistor, into the BEOL (back end of line) structure.

The resultant structure, in embodiments, is a dual-damascene copper BEOL structure, in which the copper layers, which consist of the wire and via, have a thickness of at least 3.5 microns. In at least one structure formed by the processes of the invention, a dielectric stack used is approximately 5.5 um tall, with approximately 3.5 um tall wires. In embodiments, the wires and vias have final heights of approximately 3 um and approximately 2 um, respectively, and both the via and wire have a minimum width of approximately 1.2 um.

Figure 1:
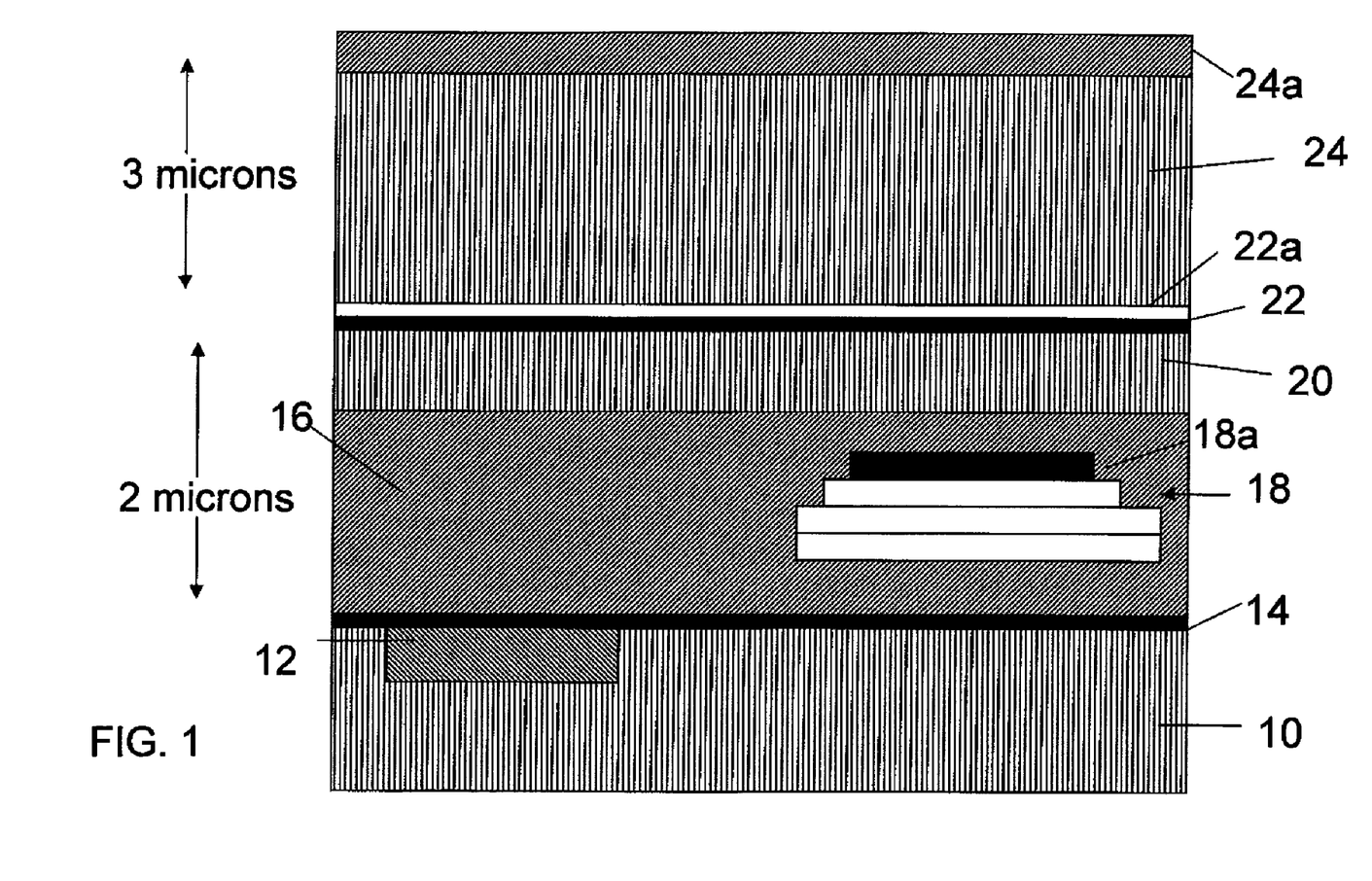
FIG. 1 shows an initial structure in accordance with the invention.

FIG. 1 shows a starting structure in accordance with the invention. The starting structure includes a damascene copper wire 12 formed in a low k dielectric material 10 used to insulate adjacent metal lines. The low k dielectric material 10 reduces undesired capacitive coupling, and hence "cross talk", between metal lines. In embodiments, the dielectric material 10 may be, for example, $SiO_2$, fluorine doped $SiO_2$ (FSG), SiCOH, polyarylene(ether), porous dielectrics, partial airgaps, or full airgaps. In embodiments, dummy fill shapes may be provided in areas without copper wiring, as known in the art, to ensure uniform dimensions; although, it should be understood that the dummy fill shapes are not required to practice the invention.

A via etch stop layer 14 such as, for example, one or more of a high density plasma (HDP), plasma enhanced CVD, or spin-on layer, such as one or more of silicon nitride, silicon carbo-nitride, silicon-oxy-carbo-nitride, or silicon carbide cap, is formed on the dielectric material 10. In embodiments, the etch stop layer 14 can be minimized over an Mx-1 layer and is, in one embodiment, in the range of approximately 25-75 nm.

Still referring to FIG. 1, an interlevel dielectric layer 16 such as, for example, an oxide based material as described previously for layer 10, is deposited on the etch stop layer 14. In one embodiment, a MIM capacitor 18 is embedded in the interlevel dielectric layer 16, using conventional processes. The MIM capacitor 18 can be any conventional stacked structure, known to those of skill in the art. In one embodiment, though, the MIM capacitor 18 includes a TiN/W/TiN bottom plate with a TiN top plate. In other embodiments, the MIM capacitor 18 uses a TaN/Ta, TaN/Ta/TaN, or TaN/Ta/TiN bottom plates. If a MIM capacitor 18 is included, then the dielectric layer 16 would be deposited in two steps, the first to MIM fabrication and the second after MIM fabrication. Any MIM dielectric, such as one or more of silicon dioxide, silicon nitride, alumina, tantalum pentoxide, in the standard thickness range of 25-75 nm, could be used, as known in the art.

After the second dielectric deposition, a planarization step, e.g., chemical mechanical polishing (CMP), can be performed removing a dielectric thickness equal to approximately 1.5 to 3 times the MIM height, followed by standard wafer cleans, as known in the art to planarize the wafer. The CMP step could also be performed after the last dielectric layer deposition (layer 24a). If the latter is implemented, then the dielectric layers above the MIM would follow the profile of the MIM (not shown).

In one embodiment, which includes a MIM capacitor 18, an etch stop layer 18a, e.g., upper silicon-nitride cap layer, silicon-carbo-nitride, silicon-oxy-carbo-nitride, or silicon-carbide etch stop layer or film similar in composition to the layer 14, is formed on the MIM capacitor 18. In one embodiment, the upper nitride layer 18a is approximately twice as thick as the etch stop layer 14 and is formed from silicon nitride. As an illustrative example, the nitride layer 18a may be approximately 150 nm thick. This ensures, as discussed in greater detail below, that subsequent etching processes will not expose the MIM capacitor 18, prior to etching to the etch stop layer 14. The MIM capacitor 18 has, in embodiments, approximately a 0.4 um total height; refractory metal conductive upper and lower plates, such as one or more of TiN, TaN, Ta, W, WN, TiSiN, TaSiN, WSiN; and a MIM dielectric such as one or more of $SiO_2$, $Si_3N_4$, $Al_2O_3$, $Ta_2O_5$, an $Al_2O_3$/$Ta_2O_5$/$Al_2O_3$ multi layer film, as known by those of skill in the art. In one embodiment, the top MIM plate is composed of TiN with the TiN RIE etched selectively to the MIM dielectric to avoid etching through the MIM dielectric and exposing the bottom MIM plate. The MIM dielectric is an $Al_2O_3$/$Ta_2O_5$/$Al_2O_3$ multi layer film, and the MIM bottom plate is a low resistance refractory metal, such as W or Ta optionally cladded below and above with TiN or TaN.

A low dielectric material 20, e.g., FSG, is formed on the silicon dioxide layer 18. The thickness of the low dielectric material 20 and the oxide layer 18, in one embodiment, is approximately 0.3 um; although other thicknesses are also contemplated by the invention. An etch stop layer 22 is formed on the low dielectric material 20, in the range of approximately 100 nm. In embodiments, the etch stop layer 22 is a silicon nitride cap layer. An optional oxide layer 22a may be formed on the etch stop layer 22 to improve adhesion of the subsequent dielectric layer 24. For example, layer 22 could include 200 nm of $SiO_2$ and layer 24 could consist of 3 um of FSG. The presence of the undoped oxide under the FSG has been shown to improve adhesion or other properties of the FSG film over silicon nitride.

A low dielectric material 24, e.g., FSG, is formed on the nitride layer 22, in any conventional manner. In embodiments, the low dielectric material 24 is approximately 3 um thick. In an optional step, a silicon dioxide layer 24a may be formed on the low dielectric material 24. In this optional step, the silicon dioxide layer 24a may be approximately 0.3 um to 0.5 um thick, and the low dielectric material 24 may be approximately 2.5 um thick. As should be understood, the silicon dioxide layer 24a may provide less variability and erosion during copper CMP (chemical mechanical polishing) processes.; and may or may not be fully removed during subsequent etching and CMP processing.

Figure 2:
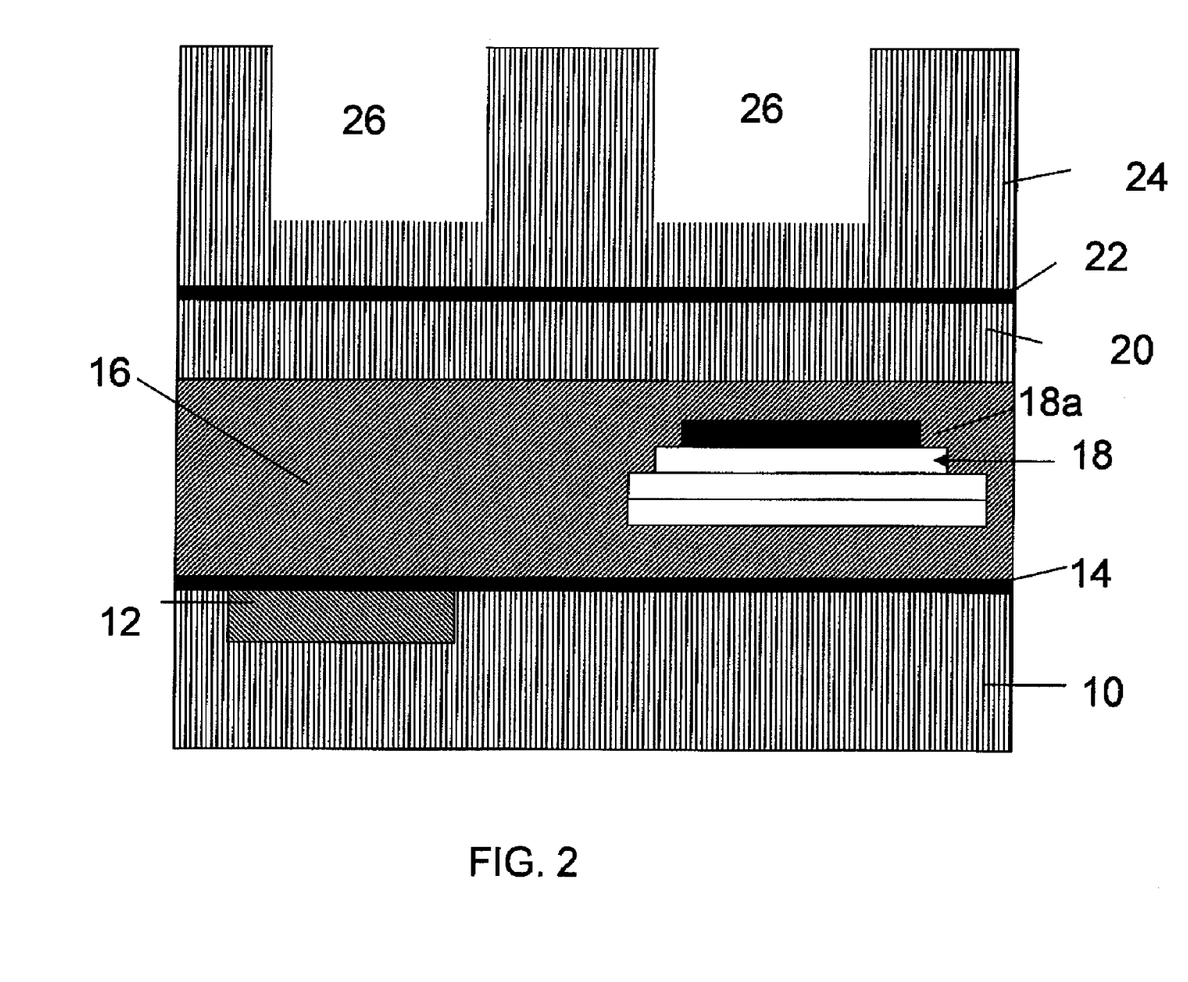
FIG. 2 shows processing steps implemented in accordance with the invention.

FIG. 2 is representative of an etching process to form partial vias in the structure of FIG. 1. In embodiments, one or more partial vias 26 are formed in the structure. In embodiments, the partial vias 26 are formed by a conventional photo resist, patterning and etching methods. For example, a photoresist can be formed on the low dielectric material 24 or alternatively the silicon dioxide layer 24a. The photoresist is exposed to light to form a pattern. The pattern is then etched using conventional RIE processes, for example, to form the partial vias 26. The photoresist preferably is stripped or removed.

In embodiments, the partial vias 26 are formed in the low dielectric material 24 in nominal alignment with the metal layer 12 and/or the MIM capacitor 18 for subsequent etching and wire formation. Depending on the thickness of the dielectric material 24 (and, in alternative embodiments, the silicon oxide layer 24a), the partial vias 26 may be etched to a depth of about ⅔ of the combined thickness of layers 24 and 24a and a width of about 1.2 um. In embodiments, the etchant chemistry is a standard RIE-based chemistry, such as $CF_4$/Ar/CO using a conventional parallel plate RIE reactor, as known by those of skill in the art, such that resist is remaining in the wafer after the RIE etch is completed. Alternatively, any standard hard mask, or ARC coated with a low temperature dielectric prior to lithographic patterning, as known in the art, could be used.

Figure 3:
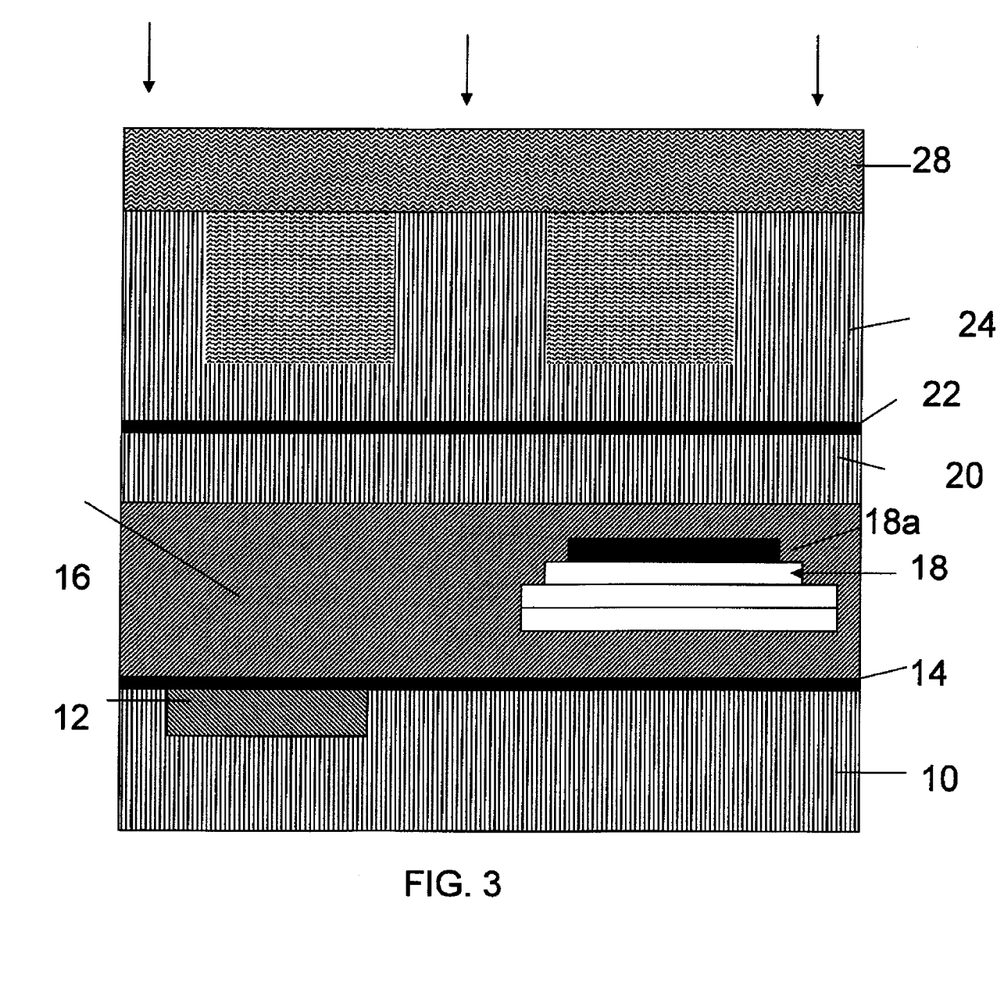
FIG. 3 shows processing steps implemented in accordance with the invention.

FIG. 3 shows a beginning process of forming a trough. In this embodiment, a negative photoresist 28 is formed on the low dielectric material 24 or alternatively on the silicon dioxide layer 24a, in addition to within the partial vias 26. It has been found that good fill properties have been obtained in the partial vias 26, with the photoresist 28. In particular, unexposed negative photoresist is removed during the develop process. This means that areas without wiring troughs are exposed to light and areas which will have wiring troughs are not exposed to light. Since the unexposed negative resist is in the partially etched vias 26, it can be easily removed during the resist develop process. This process eliminates the use of an ARC layer, thus eliminating the problems associated with ARC fill in vias and etching during the wire trough RIE etch.

Figure 4:
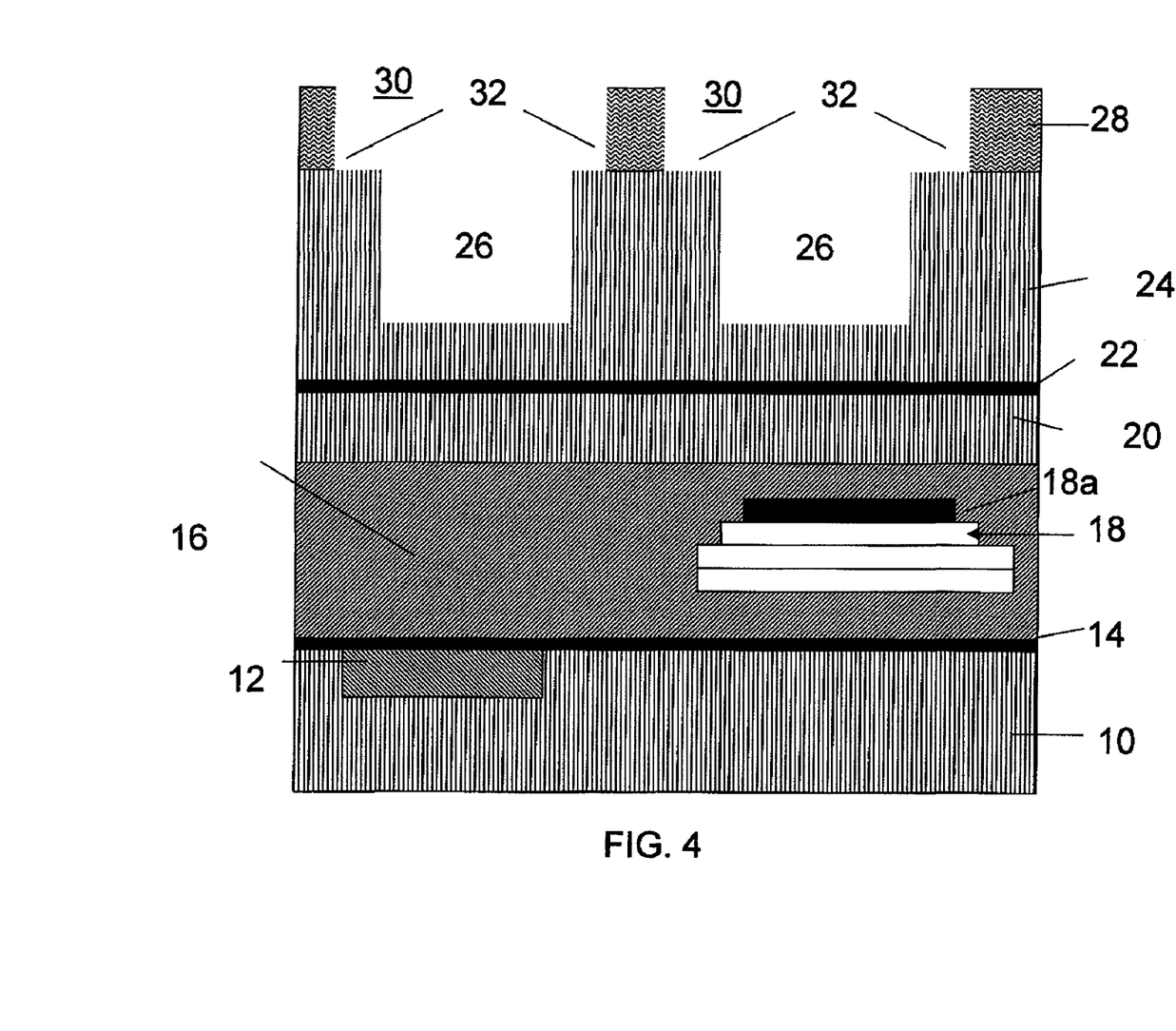
FIG. 4 shows processing steps implemented in accordance with the invention.

As shown in FIG. 4, wire trough openings 30 are formed by exposing portions of the negative photoresist, remote from the edges of the partial vias 26. The openings 30 are in substantial axial alignment with the partial vias 26. The opens 30 are formed by exposing the negative resist away from the partial vias 26, which results in the formation of via borders 32 on sides of the partial vias 26. The via borders 32 are approximately 0.6 microns or less, but greater than zero. The via borders 32 are, in embodiments, required to avoid exposure bleeding of light during the negative photoresist exposure from the edges of the partial vias 26 that are not printed, as shown in FIG. 8.

Figure 5:
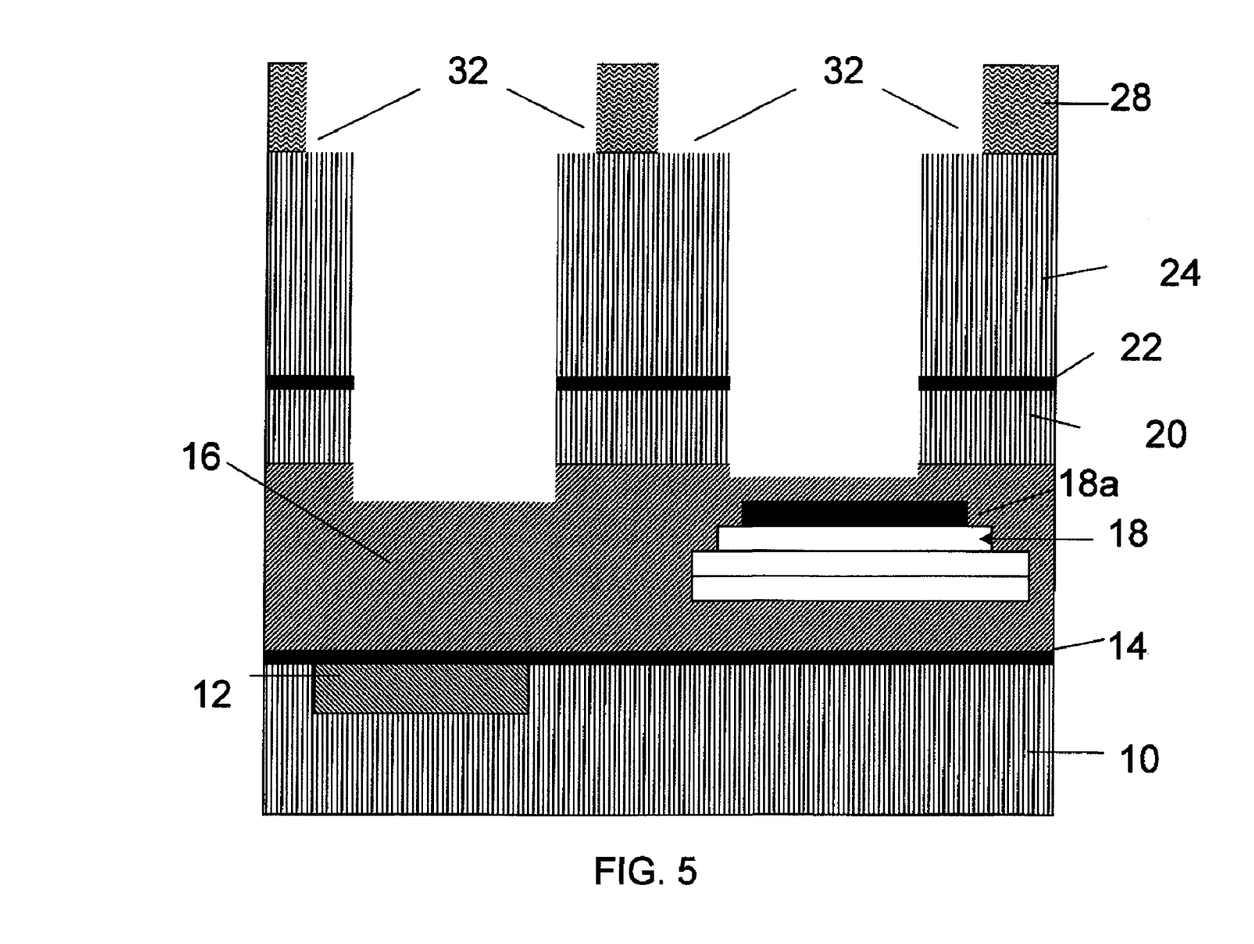
FIG. 5 shows processing steps implemented in accordance with the invention.

FIG. 5 shows additional processing steps in accordance to the invention. Subsequent to the patterning of the resist layer 28 with the wire trough openings 30, the process continues with etchant processes to etch the partial vias 26 and troughs 34 into the dielectric layer 24 such that the vias 26 are etched through the etch stop layer 22 while the troughs 34 are not etched through the etch stop layer 22. At this point in the process, the vias 26 have not reached the etch stop layer 18a. As shown in FIG. 5, the etching process will etch the partial vias 26 into the interlevel dielectric layer 16 (shown) or dielectric layer 20. In one embodiment, the via height is optimized (e.g., depending on the thickness of the layer 16, the via may be in the range of about 2 microns) to prevent the via from hitting the MIM etch stop layer 18a before the trough RIE etch hits nitride stop layer 14.

In this etching step, the etchant chemistry is non-selective to the etch stop layers, i.e., the RIE etch rate of layers 24, 20, and 16 are approximately the same as the RIE etch rate of etch stop layer 22. The non-selective etching process is timed to etch only a portion of dielectric layers 16 or 20. Portions of the dielectric layer, above the metal layer 12 and the MIM capacitor 18 will not be etched, and hence the etchant will not etch into the etch stop layers 14 and 18a, e.g., etching will stop above the nitride layer 14 (protecting the metal layer 12) and the nitride layer 18a (protecting the MIM capacitor 18).

Table 1, below, shows the RIE etching conditions for the trough (second dual damascene step), performed in an industry standard parallel plate RIE chamber. Note that other chemistries could be employed as could other RIE reactors, as long as the integration requirements discussed supra are met.

TABLE 1

| Etching Process | Process Conditions | Comments |
| --- | --- | --- |
| Non-selective RIE | Ar/CF$_4$/CHF$_3$/O$_2$ | Get bottom of partial via through the buried nitride, but stop above the MIM. In embodiments, should have minimum corner rounding of vias because it causes erosion of buried nitride layer |
| Selective Trough RIE | Ar/O$_2$/C4F8/CO | Clear trough oxide and endpoint before the bottom of partial via hits MIM nitride. In embodiments, should have very little erosion of buried nitride layer |
| Selective Via RIE | Ar/O$_2$/C$_4$F$_8$/CO | Standard Super-Selective Via Etch chemistry. In embodiments, should have sufficient overetch to ensure good connectivity between levels. |
| Resist Strip no wafer Bias | O$_2$ | Standard Resist Strip for nitride preservation |

TABLE 1-continued

| Etching Process | Process Conditions | Comments |
| --- | --- | --- |
| Resist Strip with wafer Bias | O$_2$ | Standard Resist Strip for nitride preservation |
| Silicon Nitride RIE | Ar/CF$_4$/CHF$_3$/O$_2$ | Standard Nitride Etch |
| Deflourination Clean | N$_2$/H$_2$ | Standard DF Clean for residual etch polymers |

Figure 6:
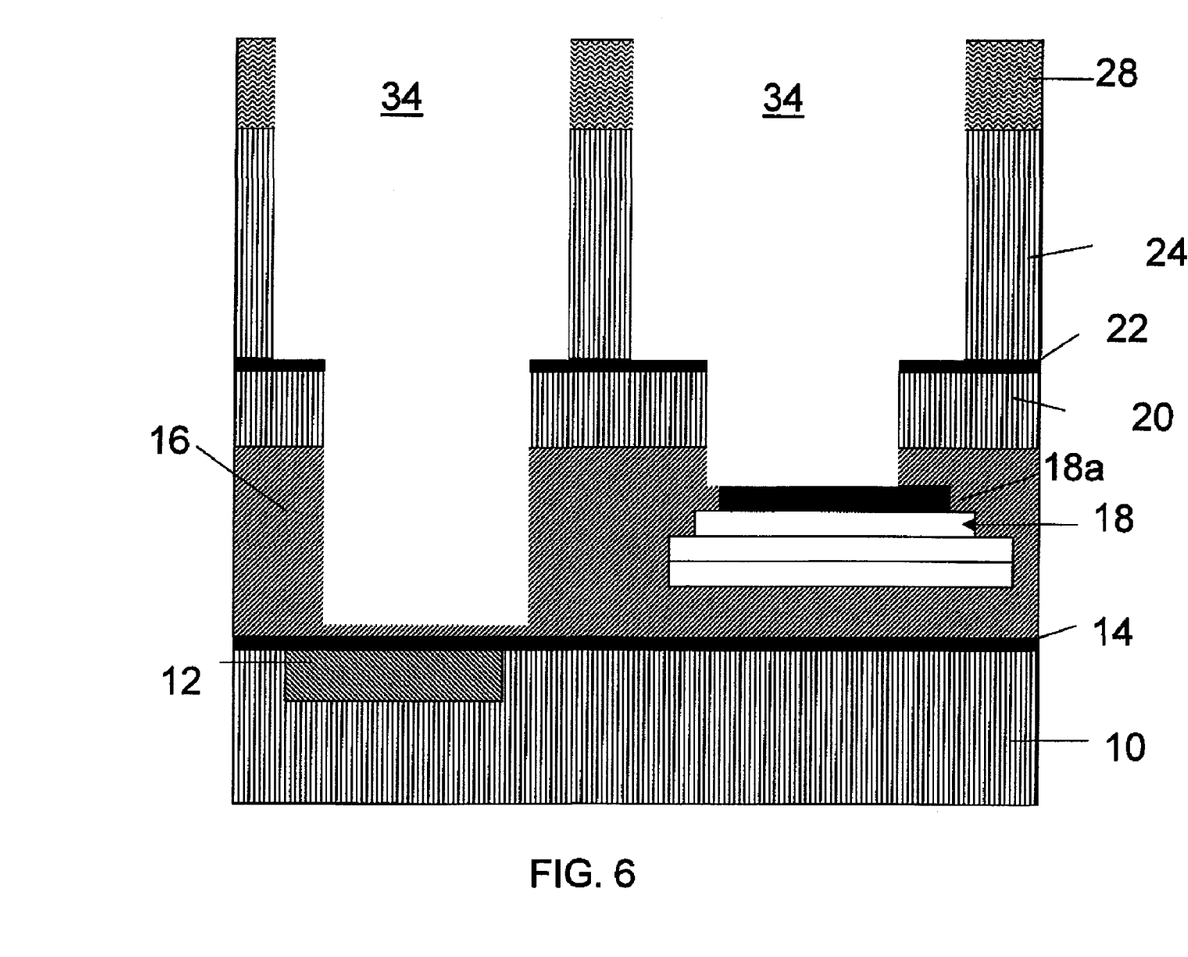
FIG. 6 shows processing steps implemented in accordance with the invention.

FIG. 6 represents a selective RIE etching process in accordance with the invention. In this processing step, an RIE etch process selective to silicon nitride is employed to form troughs 34. In this RIE processing step, as should be understood, the etch chemistry will further etch the via, preferably to slightly above the etch stop layers 14 and 18a (e.g., silicon nitride layers). However, in embodiments, during this etching process, the RIE process will etch to the etch stop layer 18a prior to etching to the etch stop layer 14. In this manner, in some implementations, the etch stop layer 18a may be slightly etched away, but at such a slow rate that the top layer of the MIM capacitor 18 will not be exposed. For this reason, the etch stop layer 18a may be thicker than the etch stop layer 14, ensuring that the MIM capacitor 18 will not be exposed during the etching process.

An aspect of maintaining RIE selectivity to the etch stop layer 18a is to limit the available oxygen in the RIE chamber by only etching the vias. If the trough 34 patterns are etched through etch stop layer 22 before the vias are fully etched, then RIE selectivity to the etch stop layer 18a is reduced or eliminated, due to oxygen liberation from the dielectric etched in the trough openings, resulting in the RIE etching into the top plate of the MIM capacitor, with resulting degraded yield or dielectric reliability of the MIM. This and other portions of the etch can be performed based on fixed times, using known etch rates, or by using optical emission spectroscopy (or any other known method) to end point the etch.

In embodiments, the trough 34 ranges about 1 micron to 100 microns in width and approximately 3 microns to 3.5 microns tall. The vias, on the other hand, are approximately 2 microns tall, post processing. It should be understood, though, that the above dimensions are provided as one non-limiting illustrative example, and that other dimensions are also equally achievable with the implementation of the present invention.

Still referring to FIG. 6, in the etchant process described, in one embodiment, 2 sccm of a $C_4F_8$ trough RIE (reactive ion etching) can be added to increase selectivity. This etchant process eliminates silicon nitride punch through at the trough edge, provides better selectivity to the MIM capacitor, and avoids polymer RIE stop and via bar RIE problems (e.g., via bars are known to have a much lower resistance to etchant chemistry). Also, in this selective etching step, the etch stop layers 14 and 18a will act as an etch stop during the selective etchant process thus ensuring the underlying metal (e.g., copper) layer 12 or the MIM capacitor 18 will not be exposed, e.g., the etch stop layers are thick enough to stop the RIE. As an additional process step, once the troughs 32 are formed, the photoresist 28 is stripped, the silicon nitride layer 14 (as well as any other exposed dielectric) is etched to expose the underlying wires 12, an optional deflourination plasma clean is performed, wafer cleans are performed, such as a 30 second 100:1 DHF clean, and the wafer is metalized by depositing refractory metal liner, copper seed, electroplating copper, and using CMP to remove excess metal, as known by those of skill in the art.

Figure 7:
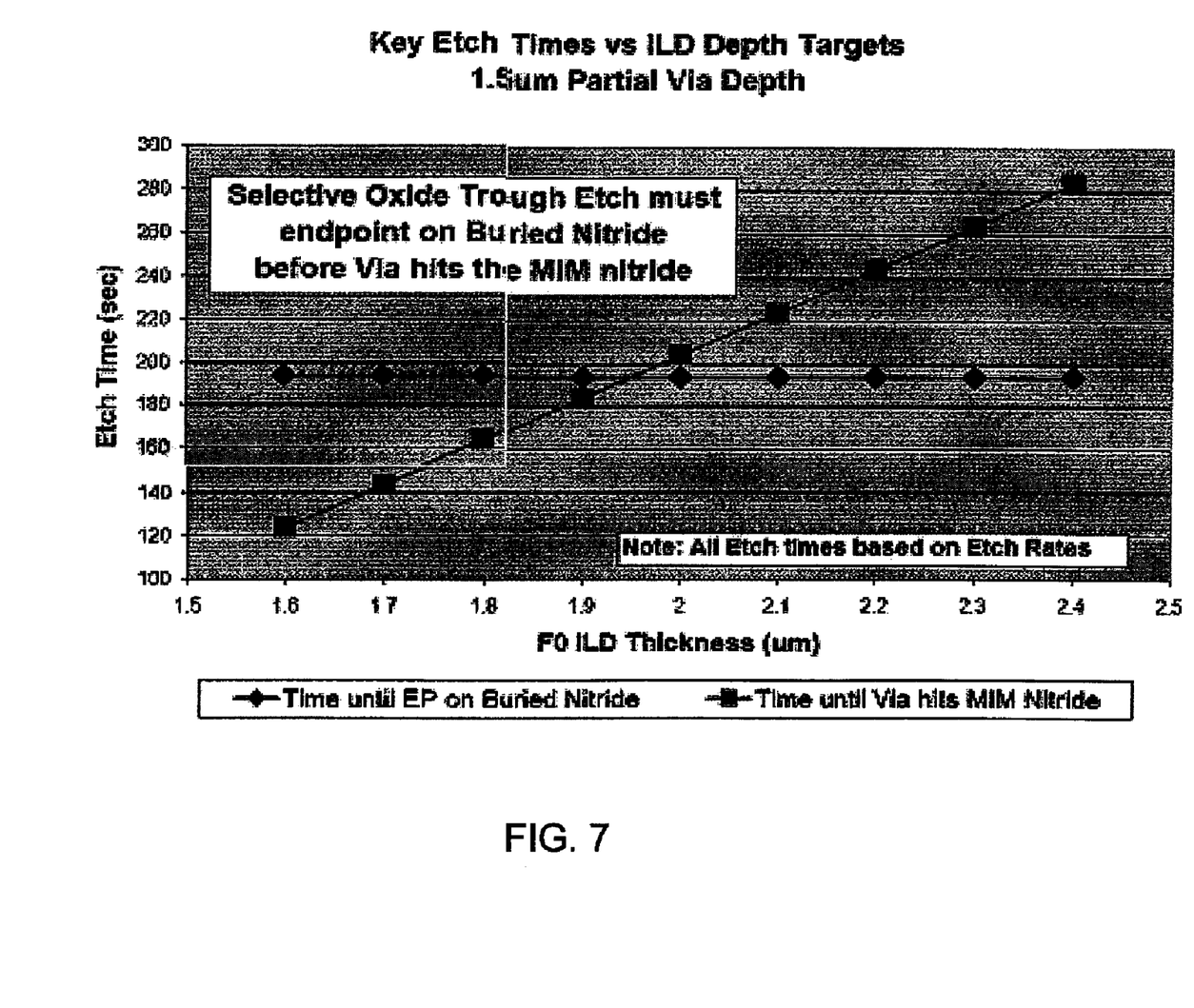
FIG. 7 shows a graph of etch time vs. interlevel depth targets for a 1.5 μm partial via depth.

It is possible to model the etch times versus wire and via height to optimize the process and avoid etching through the etch stop layer 18a. FIG. 7 shows a graph of etch time vs. interlevel depth targets for a 1.5 μm partial via depth. As shown in this graph, the horizontal line represents the time until the etch hits the etch stop layer 14 and the sloped line represents the time until the via hits the etch stop layer 18a of the MIM capacitor 18. The selective oxide trough etch has an endpoint on the etch stop layer (e.g., cap) 22 before the via hits the etch stop layer 18a of the MIM capacitor 18. In FIG. 7, the optimal via height is 1.9 a μm, post processing.

Figure 8A:
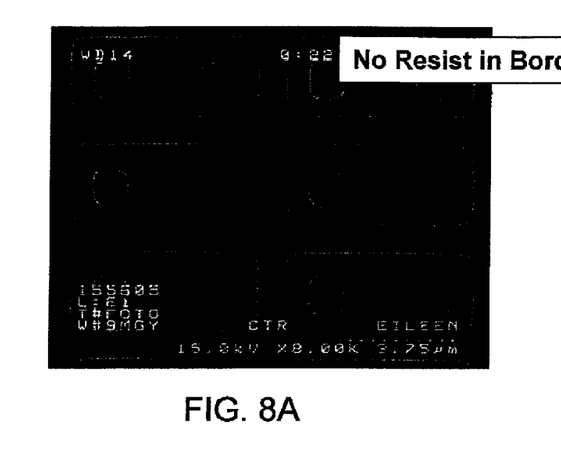
FIGS. 8A-8D show a comparison of an intermediate structure (with a border) processed in accordance with the invention and a structure with no border.
Figure 8B:
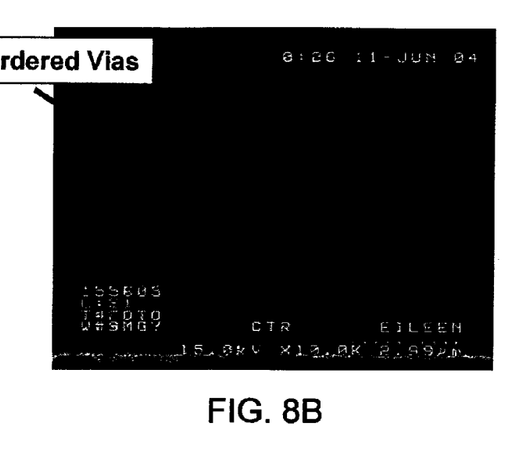
Figure 8C:
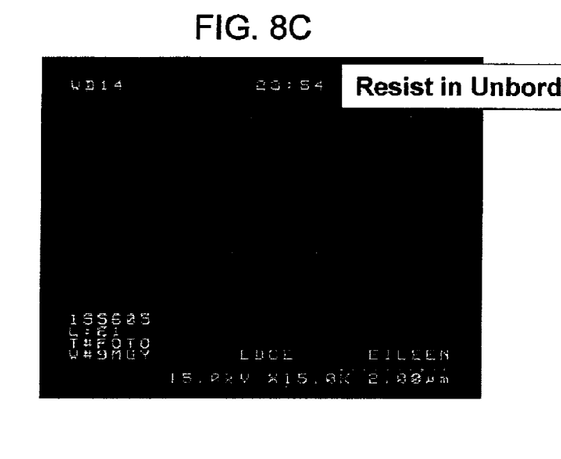
Figure 8D:
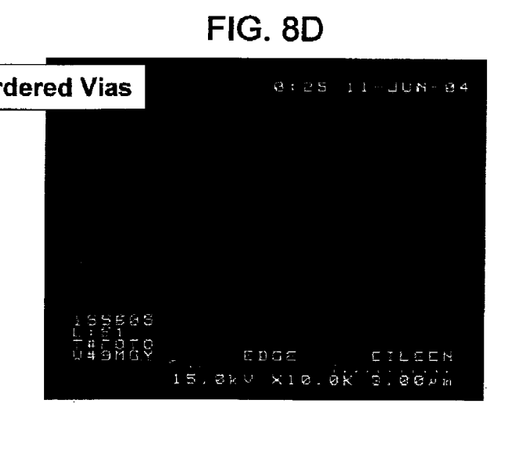

FIGS. 8A-8D show a comparison of an intermediate structure (with a 600 nm trough border around the via) processed in accordance with the invention and a structure with no border. In this representation, FIGS. 8A and 8B show, respectively, a side and top view of the structure fabricated in accordance with the invention. It is evident that no residual resist remains in the partial vias with the borders, fabricated in accordance with the present invention. However, as shown in the FIGS. 8C and 8D, using vias without borders results in residual resist remaining in the vias. That is, there is scumming in the vias. This scumming is due to the fact that light bleeds into the via and cannot be later developed out, hence impairing the subsequent etching processes to form the via and the trough.

Figure 9:
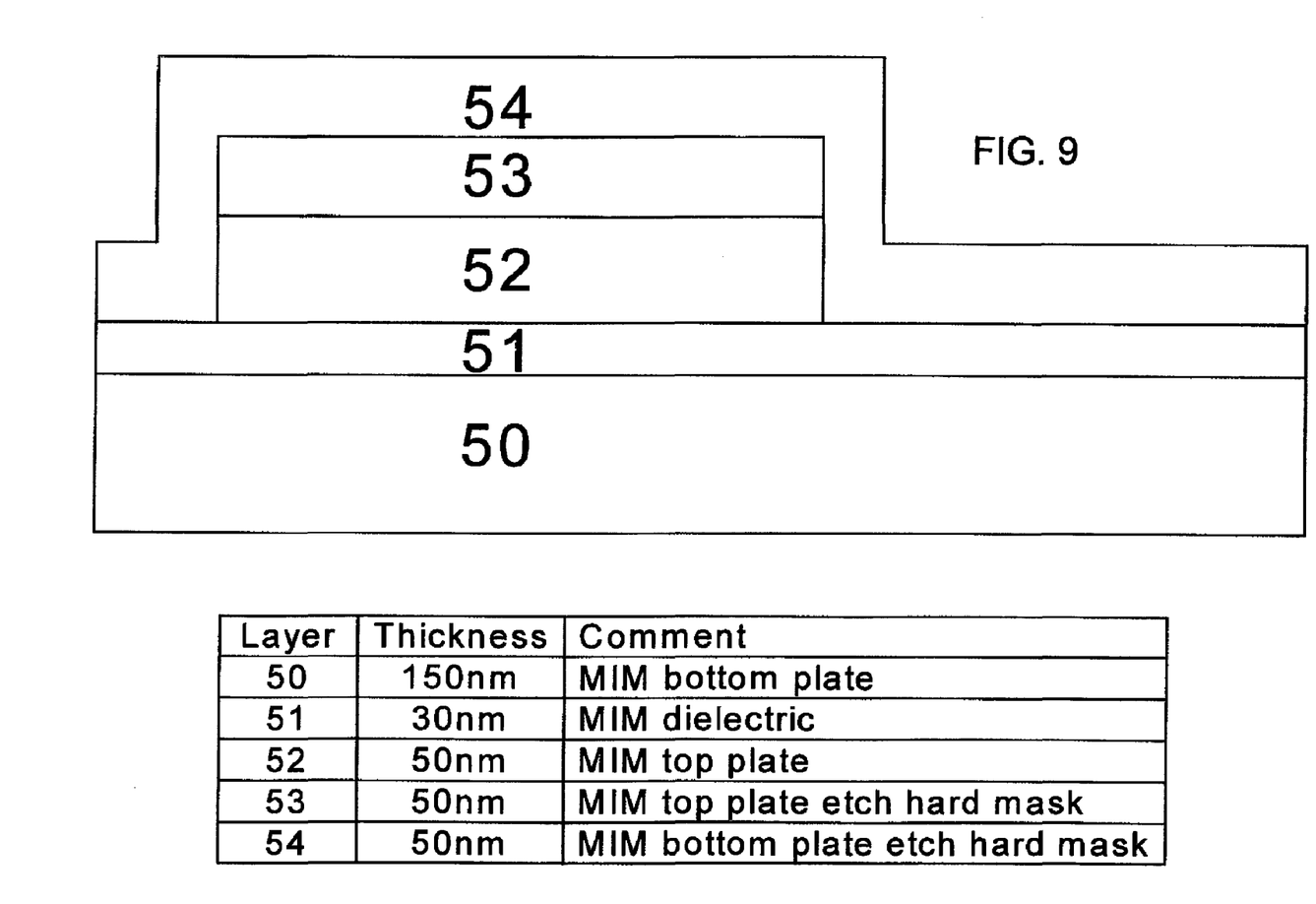
FIG. 9 shows an example of a MIM capacitor implemented with the invention.

A typical MIM capacitor is shown in FIG. 9 with each layer described in Table 2. The MIM top plate 52 and bottom plate 50 are conductors and can be composed of multiple layers. For MIM capacitors fabricated with damascene copper wiring, the plates are typically composed of refractory metals or alloys, such as W, WN, TiN, Ta, TaN, TiSiN, etc. as described above. For MIM capacitors using one or more layers of PECVD silicon oxide or silicon nitride; or CVD alumina cladded tantalum pentoxide, superior MIM reliability has been obtained when TiN, TaN, or Ta is in direct contact with the MIM dielectric 51. An additional bottom plate requirement is that it has low sheet resistance, to improve the MIM quality factor.

The MIM bottom plate 50 is contacted with vias from above, resulting in contact in areas without the top plate. This means that, to minimize the effective bottom plate resistance and maximize the MIM quality factor, the MIM bottom plate 50 needs to be relatively thick, i.e., 100-400 nm. Since the MIM top plate 52 can be contacted with vias above and strapped with wiring from above, its sheet resistance is relatively unimportant and an important parameter is it's etch resistance to the RIE etches, wet etches, and cleans performed when the vias above the MIM are fabricated.

If the via contacts the MIM top plate (i.e. etches through the etch stop layer 18a during the trough etch), the MIM dielectric integrity can be degraded due to charging damage. If the via etches completely through the MIM top plate and contacts the MIM dielectric, then the MIM top plate 52 and bottom plate 50 will either be shorted or will have poor dielectric leakage properties. Finally, hard mask or etch stop layers 53 and 54 need to be thick enough to stop the via from etching into the MIM plates. Since the MIM must fit into the via height, this means that the MIM height above the prior wiring level is limited and trade-offs are made between MIM plate resistance, MIM hard mask or etch stop layer thickness, etc. When the wafer is metalized post via and trough RIE, a wet clean, such as 100:1 DHF for 30 seconds, followed by an argon sputter clean is performed. The argon sputter clean removal of the MIM top plate should be minimized to avoid shorting the MIM top plate 52 and bottom plate 50 together, as described above. For example, the MIM capacitor formation includes sputter clean removal of a MIM top plate of less than 10 nanometer oxide equivalent sputter removal to avoid shorting the MIM top plate and bottom plate together.

TABLE 2

| Layer | Thickness | Comment |
|---|---|---|
| 50 | 150 nm | MIM bottom plate |
| 51 | 30 nm | MIM dielectric |
| 52 | 50 nm | MIM top plate |
| 53 | 50 nm | MIM top plate etch hard mask |
| 54 | 50 nm | MIM bottom plate etch hard mask |

FSG dielectric tends to have much high compressive stress than undoped silicon oxide. For this reason, undoped silicon dioxide is optionally employed for part of the via dielectric stack, where it has the least impact on wiring capacitance, to reduce the overall wafer bending. Wafers with excessive bending due to high stress films have difficulty chucking in processing tools such as lithography aligners, RIE, etc. However, it is contemplated that any dielectric can be employed for layers, not just FSG and undoped silicon dioxide. Undoped silicon dioxide can also optionally be employed above layer 24 in FIG. 1 to a thickness of approximately 100-500 nm, e.g. 300 nm. Undoped silicon oxide is less reactive than FSG with moisture in the atmosphere or during wet cleans; can reduce photoresist poisoning; and has minimal to no effect on final wiring capacitance if it is partially left on the wafer or fully removed during the layer 14 etching and subsequent Cu CMP processes.

The trough RIE chemistry should be optimized to etch both via holes and via bars since the via etch is completed during trough RIE, During the trough RIE, via bars and via holes will etch like the troughs. Once the selective trough etch endpoints on the buried etch stop layer, the chemistry will switch to a super selective via etch optimized for via holes and via bars.

The method as described above is used in the fabrication of integrated circuit chips such as CMOS, SiGe, SRAM, DRAM transistors, etc. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of exemplary embodiments, those skilled in the art will recognize that the invention can be practiced with modifications and in the spirit and scope of the appended claims.

What is claimed is:

1. A thick wire structure, comprising:
an underlying wire formed in a FSG (fluorine doped silicate glass) dielectric material;
a first nitride cap layer covering the underlying wire;
an interlevel layer formed on the first nitride cap layer;
a MIM capacitor embedded in a portion of the interlevel layer;

a MIM etch stop cap layer formed on the MIM capacitor, the MIM etch stop cap layer having a thickness greater than the first nitride cap;
a second nitride cap layer formed on the interlevel layer;
an FSG dielectric layer formed on the second nitride cap;
a via in alignment with the underlying wire, extending proximate to the first nitride cap layer; and
a trough in substantial axial alignment with the via and having a width larger than the via and extending to the second nitride cap layer.

2. The structure of claim 1, wherein the MIM capacitor is composed of refractory metals or alloys comprising at least one W, WN, TiN, Ta, TaN, and TiSiN.

3. The thick wire structure of claim 1, further comprising:
a second via in alignment with the MIM capacitor and extending proximate to the MIM etch stop cap layer; and
a second trough in substantial axial alignment with the second via formed over the MIM capacitor and extending to the second nitride cap layer.

4. The thick wire structure of claim 1, wherein a dielectric stack comprising the interlevel layer and the FSG dielectric layer is approximately 5.5 um tall, and the via has a width of about 1.2 um.

5. The thick wire structure of claim 1, wherein a bottom of the trough is at an upper surface of the second nitride cap layer.

6. The thick wire structure of claim 1, further comprising an oxide layer formed between the second nitride cap layer and the FSG dielectric layer.

7. The thick wire structure of claim 1, further comprising a silicon dioxide layer formed on the FSG dielectric layer.

8. The thick wire structure of claim 1, wherein the FSG dielectric layer is arranged over the second nitride cap layer.

9. The thick wire structure of claim 8, wherein a bottom of the trough is arranged at a level of an interface between the FSG dielectric layer and the second nitride cap layer.

* * * * *